United States Patent
Takahashi et al.

(10) Patent No.: US 9,072,175 B2
(45) Date of Patent: Jun. 30, 2015

(54) SYNTHESIZER FOR TRANSMITTER AND DIGITAL AMPLITUDE MODULATOR

(71) Applicant: KABUSHIKI KAISHA TOSHIBA, Minato-ku (JP)

(72) Inventors: Yoshihiko Takahashi, Koganei (JP); Yuuki Funahashi, Fuchu (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/196,652

(22) Filed: Mar. 4, 2014

(65) Prior Publication Data

US 2014/0320226 A1 Oct. 30, 2014

(30) Foreign Application Priority Data

Apr. 25, 2013 (JP) ................................. 2013-092732

(51) Int. Cl.
| | | |
|---|---|---|
| *H01F 30/16* | (2006.01) | |
| *H03C 1/02* | (2006.01) | |
| *H04B 1/04* | (2006.01) | |
| *H04L 27/04* | (2006.01) | |
| *H05K 7/02* | (2006.01) | |

(52) U.S. Cl.
CPC .. *H05K 7/02* (2013.01); *H03C 1/02* (2013.01); *H04L 27/04* (2013.01); *H01F 30/16* (2013.01); *H04B 2001/0491* (2013.01); *H04B 2001/0408* (2013.01)

(58) Field of Classification Search
CPC ....... H01F 17/06; H01F 17/062; H01F 19/00; H01F 30/16; H01F 38/04; H03C 1/00; H03C 1/02; H03C 1/08; H03C 1/10; H04B 1/02; H04B 1/04; H04B 1/0483; H04B 2001/0408; H04B 2001/0491; H04L 27/00; H04L 27/02; H04L 27/04
USPC ............. 332/149, 175; 336/65, 229; 361/809; 375/295, 300; 455/91, 108

See application file for complete search history.

(56) References Cited

U.S. PATENT DOCUMENTS

| | | | | |
|---|---|---|---|---|
| 4,580,111 | A * | 4/1986 | Swanson | 332/152 |
| 5,132,637 | A * | 7/1992 | Swanson | 330/10 |
| 5,150,072 | A * | 9/1992 | Malec | 330/149 |
| 5,450,444 | A * | 9/1995 | Miki et al. | 375/295 |
| 2004/0000947 | A1 * | 1/2004 | Luu | 330/10 |

FOREIGN PATENT DOCUMENTS

JP 8-237063 9/1996

* cited by examiner

*Primary Examiner* — Levi Gannon
(74) *Attorney, Agent, or Firm* — Oblon, McClelland, Maier & Neustadt, L.L.P.

(57) ABSTRACT

According to one embodiment, a synthesizer for a transmitter includes a transformer, a plurality of core support units and a fixing member. The plurality of core support units includes a support plate, fixing unit and an insertion. The support plate supports a toroidal core around which the primary winding is wound. The fixing unit fixes the toroidal core to the support plate. The insertion portion is formed inside or around the toroidal core and into which the secondary winding is inserted. The fixing member includes a plurality of receiving portions to and from which the plurality of core support units are attached and detached. The plurality of receiving portions are formed along a direction in which the plurality of core support units are stacked.

10 Claims, 10 Drawing Sheets

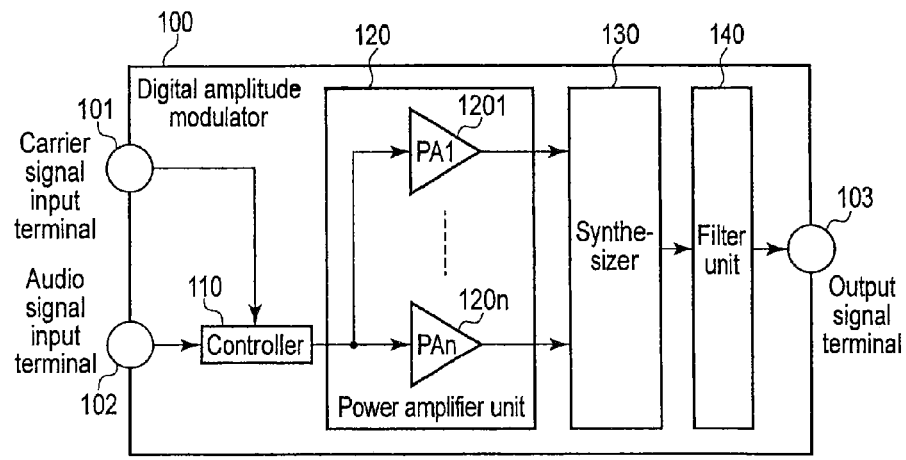
F I G. 1
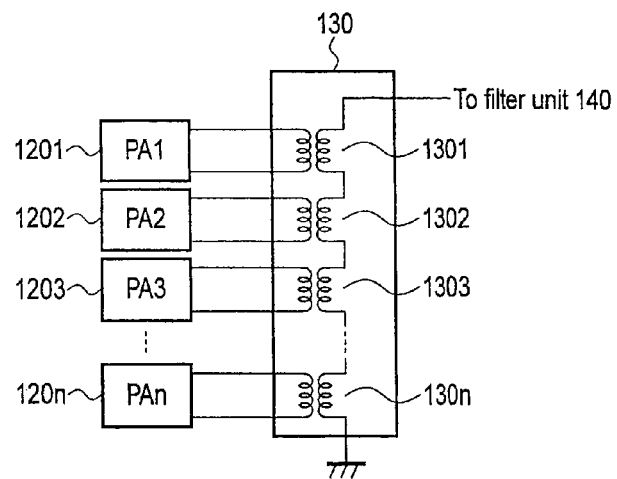
F I G. 2

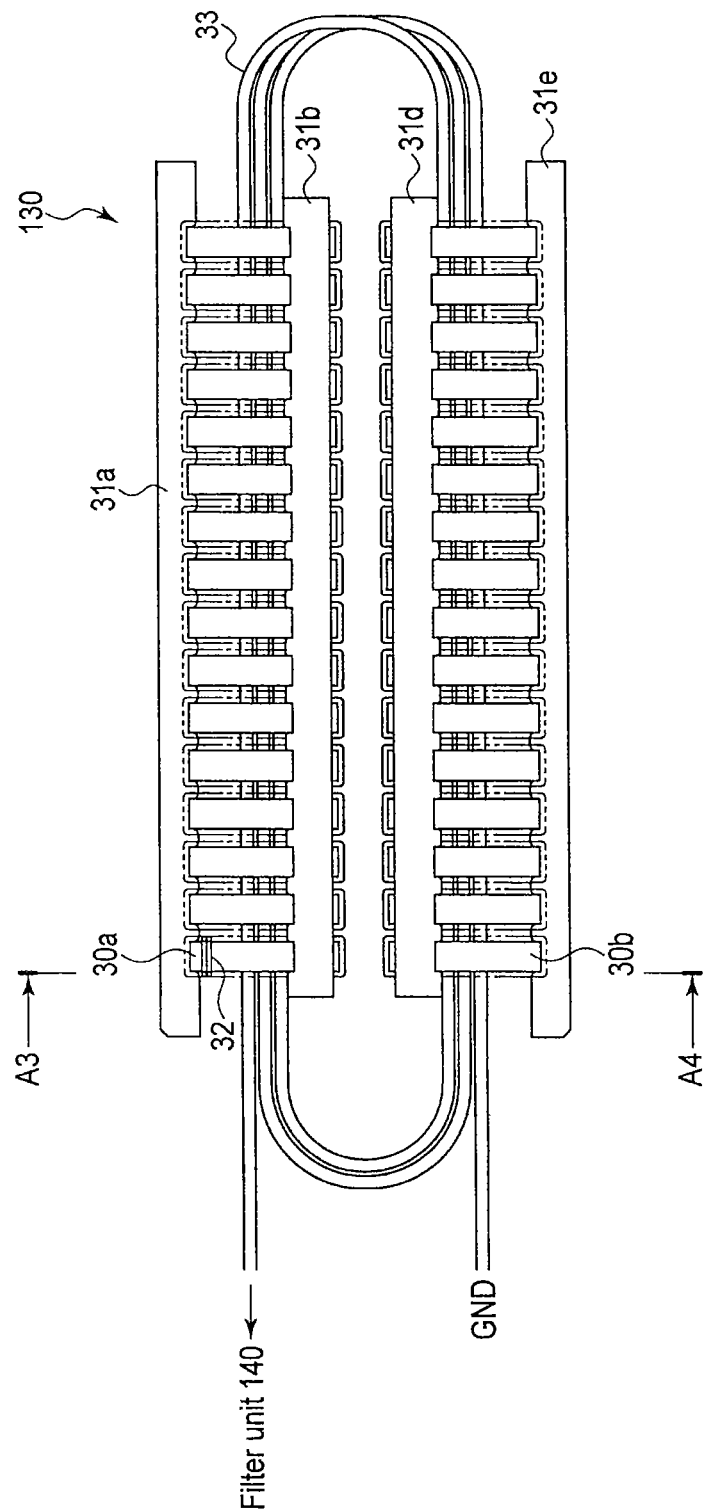
F I G. 5

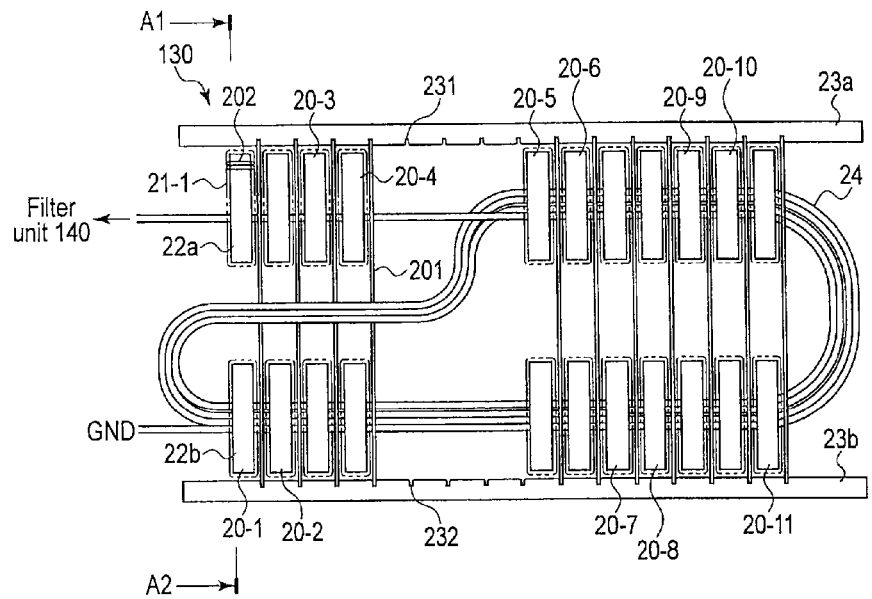
F I G. 8
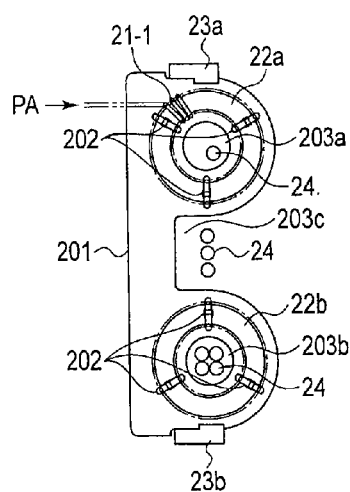
F I G. 9

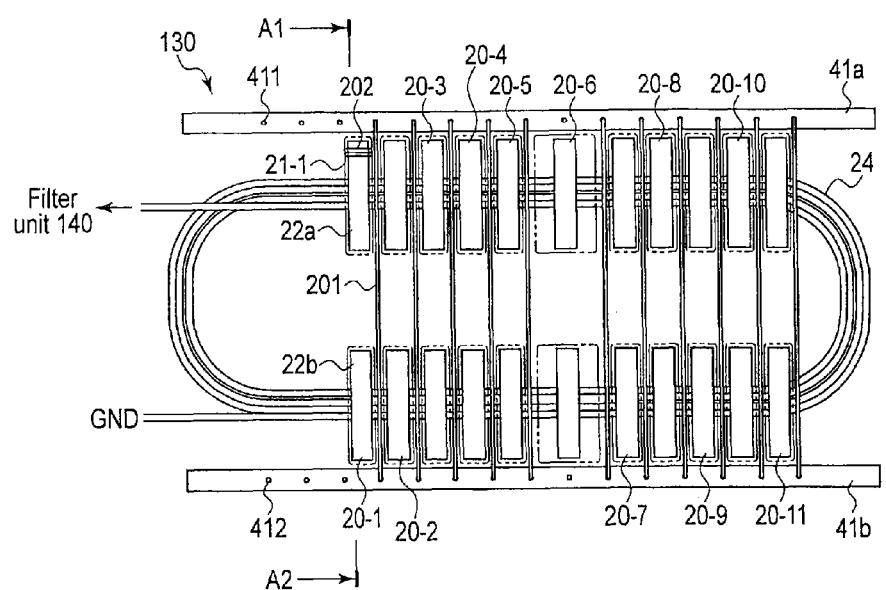
F I G. 10

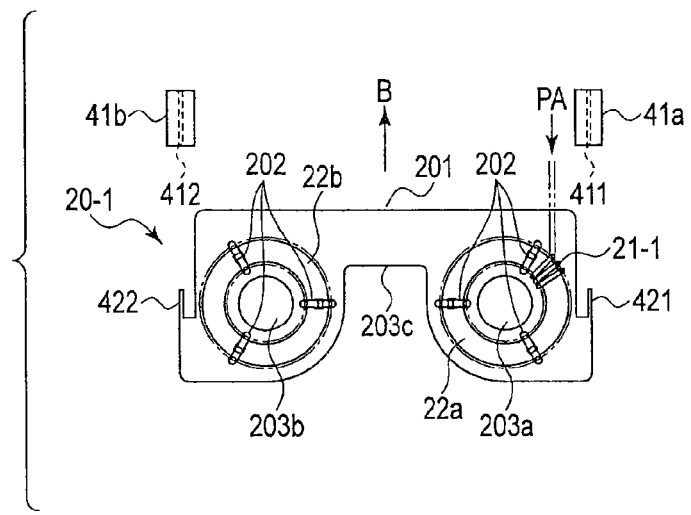
F I G. 11A
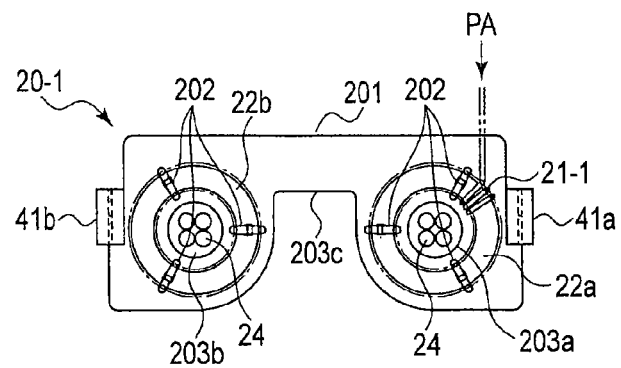
F I G. 11B

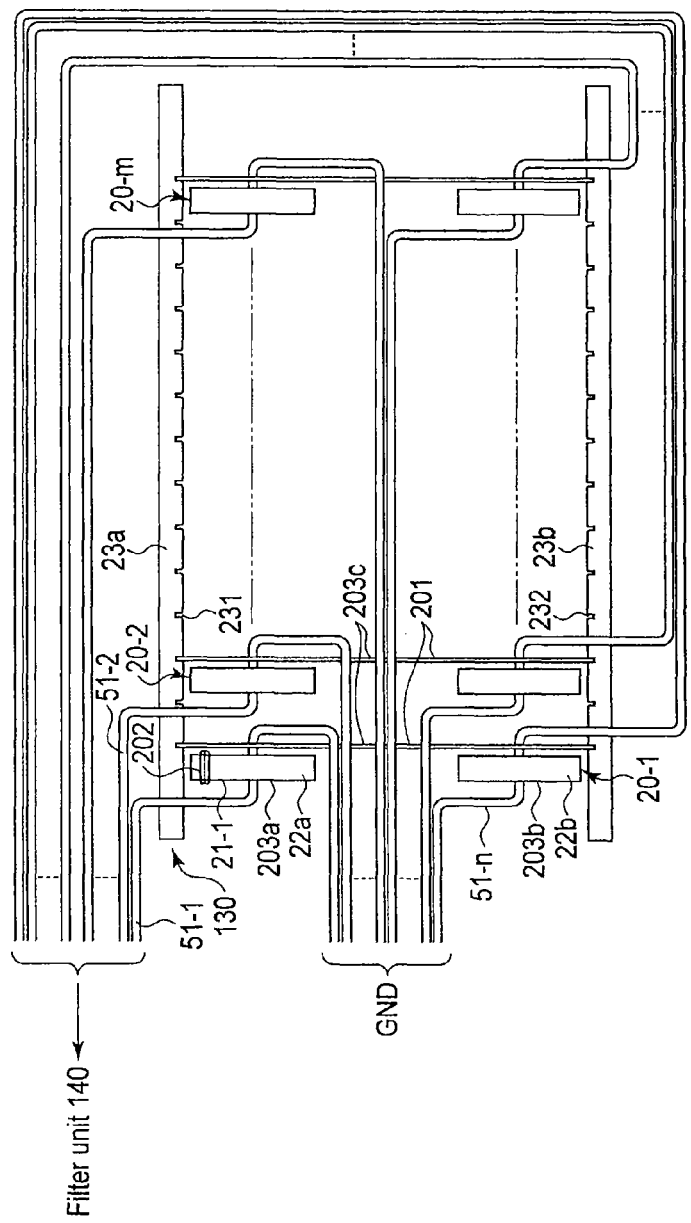
F I G. 12

SYNTHESIZER FOR TRANSMITTER AND DIGITAL AMPLITUDE MODULATOR

CROSS-REFERENCE TO RELATED APPLICATIONS

This application is based upon and claims the benefit of priority from Japanese Patent Application No. 2013-092732, filed Apr. 25, 2013, the entire contents of which are incorporated herein by reference.

FIELD

Embodiments described herein relate generally to a synthesizer using a toroidal core to be used in a transmitter for medium-frequency broadcasting, and a digital amplitude modulator including the synthesizer.

BACKGROUND

A digital amplitude modulator is used in a transmitter for, e.g., medium-frequency broadcasting. The digital amplitude modulator includes a plurality of power amplifiers arranged in parallel. The plurality of power amplifiers are turned on or off in accordance with the voltage amplitude level of a signal to be modulated. Consequently, the number of power amplifiers to which amplified carrier signals are output is changed. An AM wave (Amplitude Modulation Wave) is generated by synthesizing the output signals from power amplifiers in an ON state. The generated AM wave is transmitted to a predetermined broadcasting service area.

In the above-mentioned digital amplitude modulator, a transformer using a plurality of toroidal cores is used in a synthesizer for synthesizing the outputs from the plurality of power amplifiers. The synthesizer changes the output power from the power amplifier by changing the turn ratio of the transformer. A serial addition transformer has a structure in which a core is sandwiched. To manufacture this transformer, it is necessary to fix a plurality of cores by positioning them beforehand.

BRIEF DESCRIPTION OF THE SEVERAL VIEWS OF THE DRAWING

FIG. 1 is a block diagram showing the arrangement of a digital amplitude modulator according to an embodiment;

FIG. 2 is a circuit diagram showing a practical arrangement of a synthesizer according to the embodiment;

FIG. 5 is a plan view showing a synthesizer from the front surface as a comparative example;

FIG. 8 is a view for explaining an arrangement in which the number of turns of a secondary winding is changed for each Mn—Zn-based ferrite core in the core support unit in the first embodiment;

FIG. 9 is a view showing, from the side surface, the core support unit when the number of turns of the secondary winding is changed for each Mn—Zn-based ferrite core in the core support unit in the first embodiment;

FIG. 10 is a plan view showing a synthesizer according to the second embodiment from the front surface;

FIG. 11A is a view showing, from a side surface, a core support unit in the synthesizer according to the second embodiment, and illustrates a state before the core support unit is attached to fixing units;

FIG. 11B is a view showing, from the side surface, the core support unit in the synthesizer according to the second embodiment, and illustrates a state after the core support unit is attached to the fixing units;

FIG. 12 is a plan view showing a synthesizer according to the third embodiment from the front surface.

DETAILED DESCRIPTION

Figure 3:
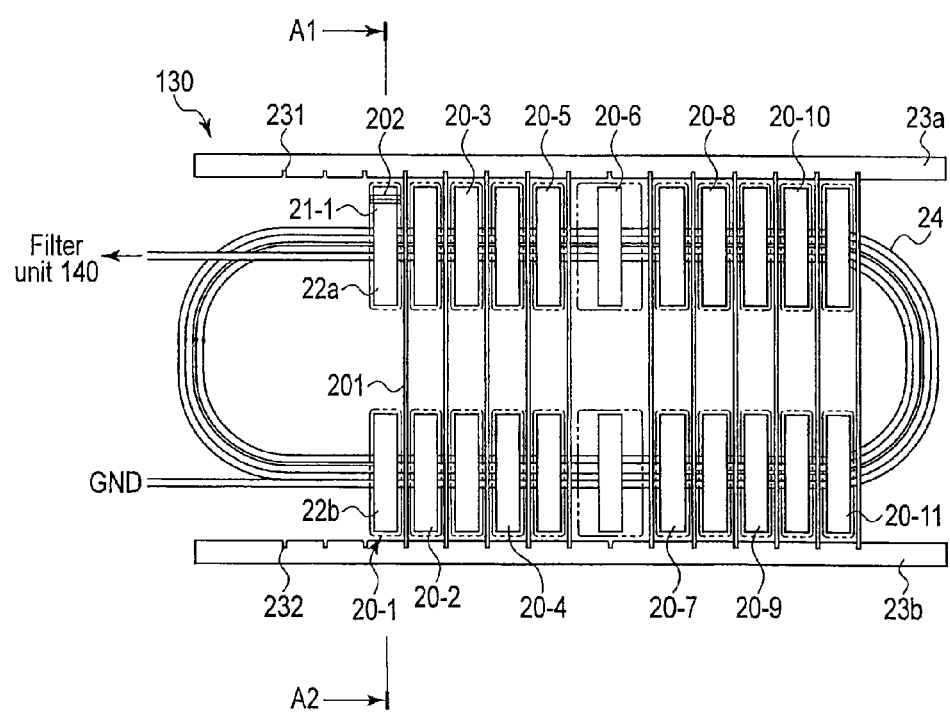
FIG. 3 is a plan view showing, from the front surface, a synthesizer according to the first embodiment.

In general, according to one embodiment, a synthesizer for a transmitter includes a transformer, a plurality of core support units and a fixing member. The transformer includes a primary winding connected to a plurality of amplifiers, and a secondary winding which opposes the primary winding. The plurality of core support units includes a support plate, fixing unit and an insertion. The support plate supports a toroidal core around which the primary winding is wound. The fixing unit fixes the toroidal core to the support plate. The insertion portion is formed inside or around the toroidal core and into which the secondary winding is inserted. The fixing member includes a plurality of receiving portions to and from which the plurality of core support units are attached and detached. The plurality of receiving portions are formed along a direction in which the plurality of core support units are stacked.

FIG. 1 is a block diagram showing the arrangement of a digital amplitude modulator according to an embodiment.

A carrier signal as a transmission signal is input to a carrier signal input terminal 101 of a digital amplitude modulator 100 shown in FIG. 1. This carrier signal input to the carrier signal input terminal 101 is distributed to n (n is an arbitrary natural number) power amplifiers 1201 to 120n of a power amplifier unit 120 by a controller 110. Each of the power amplifiers 1201 to 120n is turned on=driven state or turned off=stopped state under the control of the controller 110, and outputs an amplified carrier signal in the ON state.

A synthesizer 130 synthesizes the amplified carrier signals, and a filter unit 140 filters the synthetic signal. The filtered signal is output as an amplitude-modulated, RF-band broadcasting wave (AM wave) from an output signal terminal 103. A transmission antenna (not shown) is connected to the output signal terminal 103, and a matching circuit, filter, rejecter, track circuit, and the like are generally inserted between them.

On the other hand, an audio signal (a signal to be modulated) input to an audio signal input terminal 102 of the digital amplitude modulator 100 is input to the controller 110. In accordance with the voltage amplitude of the input audio signal, the controller 110 controls the ON/OFF state of each of the power amplifiers 1201 to 120n by using an ON/OFF control signal or the phase difference between carrier signals.

FIG. 2 is a circuit diagram showing a practical arrangement of the synthesizer 130 in the digital amplitude modulator 100 shown in FIG. 1.

The synthesizer 130 includes n transformers 1301 to 130n. The primary windings of the transformers 1301 to 130n are respectively connected to the output terminals of the power amplifiers 1201 to 120n. The secondary windings of the transformers 1301 to 130n are connected in series. One end of the secondary winding of the transformer 1301 is a synthetic output terminal and connected to the filter unit 140. One end of the secondary winding of the transformer 130n is a ground terminal and grounded. Note that the ground terminal may also be grounded via a coil, a capacitor, a resistor, or a combination thereof.

That is, in the synthesizer 130, when a carrier signal whose power is amplified by one of the power amplifiers 1201 to 120n is applied to the primary winding, this carrier signal is output to the secondary winding and synthesized. This synthetic output is supplied to the filter unit 140.

First Embodiment

In the first embodiment, core support units for supporting two toroidal Mn—Zn-based ferrite cores around which primary windings 21-1 to 21-n of the transformers 1301 to 130n are wound are fixed by grooves of fixing units.

FIG. 3 is a plan view showing the first embodiment of the synthesizer 130.

FIG. 3 shows a state in which m core support units 20-1 to 20-m (FIG. 3 shows only 20-1 to 20-11) for supporting two toroidal Mn—Zn-based ferrite cores 22a and 22b around which the primary windings 21-1 to 21-n (FIG. 3 shows only 21-1) of the transformers 1301 to 130n are wound are fixed to upper and lower fixing units 23a and 23b.

In the fixing units 23a and 23b, a plurality of grooves 231 and 232 are formed along a direction (a crosswise direction in FIG. 3) in which the core support units 20-1 to 20-m are stacked.

The m core support units 20-1 to 20-m are fixed to the fixing units 23a and 23b so as to be detachable in a back-and-forth direction. The m core support units 20-1 to 20-m will be explained below by taking the core support unit 20-1 as an example.

Figure 4A:
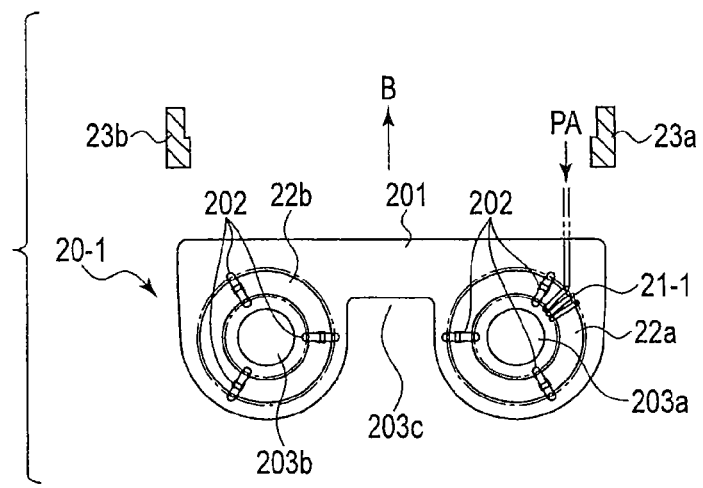
FIG. 4A is a view showing, from a side surface, a core support unit in the synthesizer according to the first embodiment, and illustrates a state before the core support unit is attached to fixing units.
Figure 4B:
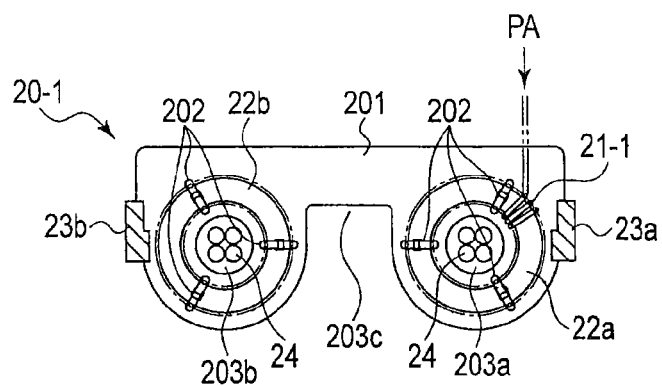
FIG. 4B is a view showing, from the side surface, the core support unit in the synthesizer according to the first embodiment, and illustrates a state after the core support unit is attached to the fixing units.

FIGS. 4A and 4B are views showing the core support unit 20-1 in a direction indicated by arrows A1 and A2 in FIG. 3.

The core support unit 20-1 includes one support plate 201 and the two toroidal Mn—Zn-based ferrite cores 22a and 22b. The support plate 201 supports the Mn—Zn-based ferrite cores 22a and 22b. The toroidal Mn—Zn-based ferrite cores 22a and 22b are fixed to the support plate 201 by binding wires 202.

Note that the Mn—Zn-based ferrite cores 22a and 22b are formed into, e.g., a ring-like shape. Note also that the toroidal Mn—Zn-based ferrite cores 22a and 22b may also be fixed to the support plate 201 by adhesive portions (not shown).

Insertion portions 203a and 203b for inserting secondary windings 24 of the transformers 1301 to 130n are formed inside the Mn—Zn-based ferrite cores 22a and 22b. An insertion portion 203c is formed between the Mn—Zn-based ferrite cores 22a and 22b. This insertion portion for inserting the secondary winding 24 need not be formed between the Mn—Zn-based ferrite cores 22a and 22b, and may also be formed around the Mn—Zn-based ferrite core 22a or 22b.

FIG. 4A shows a state before the core support unit 20-1 is attached to the fixing units 23a and 23b. When attaching the core support unit 20-1 to the fixing units 23a and 23b, the back surface of the support plate 201 is first engaged with the grooves 231 and 232 of the fixing units 23a and 23b. Then, when the support plate 201 is inserted deeply in the direction of an arrow B shown in FIG. 4A, the core support unit 20-1 is fixed to the fixing units 23a and 23b as shown in FIG. 4B. The core support units 20-2 to 20-m are also fixed to the fixing units 23a and 23b in the same manner as for the core support unit 20-1.

After that, the secondary winding 24 is inserted into the insertion portions 203a and 203b while the n core support units 20-1 to 20-m are fixed to the fixing units 23a and 23b.

Next, the operation of the above-mentioned arrangement will be explained by taking an example in which the number of turns of the secondary winding 24 is changed.

Figure 6:
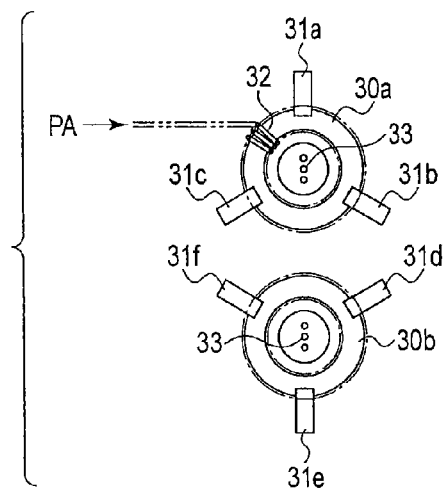
FIG. 6 is a view showing the arrangement of toroidal Mn—Zn-based ferrite cores from a side surface as a comparative example.

FIG. 5 is a plan view showing a conventional synthesizer 130 as a comparative example of this embodiment. FIG. 6 is a view showing toroidal Mn—Zn-based ferrite cores 30a and 30b in a direction indicated by arrows A3 and A4 in FIG. 5.

As shown in FIG. 5, the synthesizer 130 includes a plurality of toroidal Mn—Zn-based ferrite cores 30a. As shown in FIGS. 5 and 6, the plurality of Mn—Zn-based ferrite cores 30a are fixed as they are sandwiched by three support members 31a, 31b, and 31c.

The synthesizer 130 also includes a plurality of toroidal Mn—Zn-based ferrite cores 30b. As shown in FIGS. 5 and 6, the plurality of Mn—Zn-based ferrite cores 30b are fixed as they are sandwiched by three support members 31d, 31e, and 31f.

To determine the fixing portions of the plurality of Mn—Zn-based ferrite cores 30a and 30b, a plurality of grooves are formed in the support members 31a, 31b, 31c, 31d, 31e, and 31f. For example, the Mn—Zn-based ferrite cores 30a and 30b are fixed to the grooves formed in the support members 31a, 31b, 31c, 31d, 31e, and 31f, while primary windings 32 are wound around the Mn—Zn-based ferrite cores 30a and 30b. A serial addition synthesizer is formed by inserting a secondary winding 33 into the center.

To change the number of turns of the secondary winding 33 in the synthesizer 130 as described above, all of the plurality of Mn—Zn-based ferrite cores 30a and 30b must be detached from the support members 31a, 31b, 31c, 31d, 31e, and 31f, and this worsens the work efficiency.

Also, the width of the grooves formed in the support members 31a, 31b, 31c, 31d, 31e, and 31f is determined in accordance with the number of turns of the primary windings 32. Therefore, if it is necessary to increase the number of turns of the primary windings 32 wound around specific ferrite cores 30a and 30b, the width of the grooves formed in the support members 31a, 31b, 31c, 31d, 31e, and 31f must be changed in accordance with the increased number of turns of the primary windings 32. That is, it is not easy to change the number of turns of the primary windings 32 in the arrangement as described above.

Furthermore, the ferrite cores 30a and 30b are not fitted in the groves formed in the support members 31a, 31b, 31c, 31d, 31e, and 31f in some cases due to an error caused by the way the primary windings 32 are wound around the ferrite cores 30a and 30b, or a dimensional error of the ferrite cores 30a and 30b.

Figure 7:
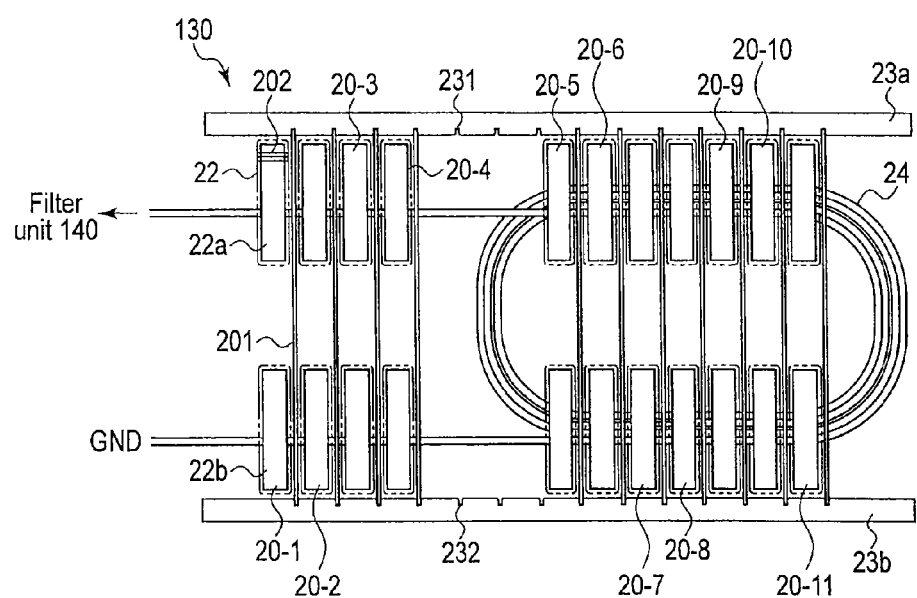
FIG. 7 is a view for explaining an arrangement in which the number of turns of a secondary winding is changed for each core support unit in the first embodiment.

In the first embodiment as shown in FIG. 7, when changing the number of turns of the secondary winding 24 to "1" with respect to the core support units 20-1 to 20-4, the secondary winding 24 is first removed from the synthesizer 130, and then the core support units 20-1 to 20-4 are detached from the fixing units 23a and 23b. Subsequently, the core support units 20-1 to 20-4 are attached to the fixing units 23a and 23b so as to be shifted by two grooves 231 and 232 to the left in FIG. 7.

After that, one wire of the secondary winding 24 is inserted into the insertion portions 203a and 203b of the core support units 20-1 to 20-4, and four wires of the secondary winding 24 are inserted into the insertion portions 203a and 203b of the core support units 20-5 to 20-11. Accordingly, it is only necessary to detach the core support units 20-1 to 20-4 for which the number of turns of the secondary winding 24 is to be changed from the fixing units 23a and 23b, and change the fixing positions with respect to the fixing units 23a and 23b. That is, nothing needs to be performed on the core support units 20-5 to 20-11 for which the number of turns of the secondary winding 24 is not to be changed.

Also, in the first embodiment as shown in FIG. 8, when changing the number of turns of the secondary winding 24 to "1" with respect to the Mn—Zn-based ferrite cores 22a of the core support units 20-1 to 20-4, and changing the number of turns of the secondary winding 24 to "4" with respect to the Mn—Zn-based ferrite cores 22b of the core support units 20-1 to 20-4, the secondary winding 24 is first removed from the synthesizer 130, and then the core support units 20-1 to 20-4 are detached from the fixing units 23a and 23b. Subsequently, the core support units 20-1 to 20-4 are attached to the fixing units 23a and 23b so as to be shifted by two grooves 231 and 232 to the left in FIG. 8.

After that, one wire of the secondary winding 24 is inserted into the insertion portions 203a of the core support units 20-1 to 20-4, and four wires of the secondary winding 24 are inserted into the insertion portions 203a and 203b of the core support units 20-5 to 20-11.

As shown in FIG. 9 as a view taken along a direction indicated by arrows A1 and A2 in FIG. 8, three wires of the secondary winding 24 are inserted into the insertion portions 203c of the core support units 20-1 to 20-4, and four wires of the secondary winding 24 are inserted into the insertion portions 203b of the core support units 20-1 to 20-4. Accordingly, it is only necessary to detach the core support units 20-1 to 20-4 for which the number of turns of the secondary winding 24 is to be changed from the fixing portions 23a and 23b, and change the fixing positions with respect to the fixing units 23a and 23b. That is, nothing needs to be performed on the core support units 20-5 to 20-11 for which the number of turns of the secondary winding 24 is not to be changed.

In the first embodiment as described above, the plurality of core support units 20-1 to 20-11 have the arrangement in which one support plate 201 supports the two toroidal Mn—Zn-based ferrite cores 22a and 22b.

The primary windings 21-1 are wound around the toroidal Mn—Zn-based ferrite cores 22a and 22b, and the insertion portions 203a, 203b, and 203c for inserting the secondary winding 24 are formed inside and between the Mn—Zn-based ferrite cores 22a and 22b. The plurality of core support units 20-1 to 20-11 are attached to the grooves 231 and 232 of the fixing units 23a and 23b so as to be detachable therefrom.

Accordingly, it is readily possible to change the fixing positions of, e.g., the core support units 20-1 to 20-4 with respect to the fixing units 23a and 23b. This makes it easier to increase or decrease the turn ratio of the secondary winding 24 opposing given Mn—Zn-based ferrite cores 22a and 22b, in order to change the turn ratio of the transformers 1301 to 130n.

Also, it is readily possible to take a measure against a case in which the way of winding is biased because the turn ratio of the transformers 1301 to 130n is changed for each of the Mn—Zn-based ferrite cores 22a and 22b, and the thickness of the primary winding 21-1 changes. This is so because a measure can easily be taken in the thickness direction by changing the fixing positions of the core support units 20-1 to 20-4 with respect to the fixing units 23a and 23b.

For example, in the first embodiment, the distances from the core support unit 20-6 to adjacent core support units 20-5 and 20-7 are made longer than those between other core support units, as shown in FIG. 3. This makes it easier to take a measure when the thickness of the primary winding 21-1 changes. Note that the first embodiment has been explained by taking an example in which the distances from the core support unit 20-6 to adjacent core support units 20-5 and 20-7 are made longer than those between other core support units, but this similarly applies to other core support units.

In addition, in the first embodiment, it is possible to manufacture the individual Mn—Zn-based ferrite cores 22a and 22b and the support plate 201 for supporting the Mn—Zn-based ferrite cores 22a and 22b, and finally fix the core support units 20-1 to 20-11 to the fixing units 23a and 23b. This improves the workability in, e.g., disassembly or relocation. It is also possible to freely change the distance between, e.g., the core support units 20-3 and 20-4. This makes it possible to freely change the distances between the Mn—Zn-based ferrite core 22a of the core support unit 20-3, which generates a large amount of heat, and other Mn—Zn-based ferrite cores 22a.

Furthermore, it is possible to detach a given core support unit 20-4 from the fixing units 23a and 23b, and easily change the number of turns of the primary windings 21-4 of the Mn—Zn-based ferrite cores 22a and 22b on the core support unit 20-4. Therefore, not all the cores need be detached, so the work can efficiently be performed.

In the first embodiment, if the Mn—Zn-based ferrite core 22a breaks due to heat, the broken pieces fall on the support plate 201. This decreases the possibility that a conductive broken piece is caught between cores and gives damage to the whole synthesizer 130 by conduction. This also decreases the possibility that a broken piece damages the primary windings 21-1 to 21-11 or secondary winding 24.

Also, in the first embodiment, the Mn—Zn-based ferrite cores 22a and 22b are supported by one support plate 201. This improves the vibration resistance to the Mn—Zn-based ferrite cores 22a and 22b. This decreases the possibility that, e.g., the Mn—Zn-based ferrite cores 22a and 22b are given stress and broken during transportation.

Additionally, in the first embodiment, a wind for cooling is guided to the gaps between the core support units 20-1 to 20-11 or to the insertion portions 203c of the secondary winding 24, and removes heat generated from the Mn—Zn-based ferrite cores 22a and 22b. This facilitates cooling the Mn—Zn-based ferrite cores 22a and 22b.

Second Embodiment

In the second embodiment, core support units for supporting two toroidal Mn—Zn-based ferrite cores around which primary windings 21-1 to 21-n of transformers 1301 to 130n are wound are fixed in holes in fixing units. FIG. 10 is a plan view showing the second embodiment of the synthesizer 130. The same reference numerals as in FIG. 3 denote the same parts in FIG. 10, and a detailed explanation thereof will be omitted.

FIG. 10 shows a state in which m core support units 20-1 to 20-m (FIG. 10 shows only 20-1 to 20-11) for supporting two toroidal Mn—Zn-based ferrite cores 22a and 22b around which the primary windings 21-1 to 21-n (FIG. 10 shows only 21-1) of the transformers 1301 to 130n are wound are fixed to upper and lower fixing units 41a and 41b.

A plurality of holes 411 and 412 are formed in the fixing units 41a and 41b along a direction (a crosswise direction in FIG. 10) in which the core support units 20-1 to 20-m are stacked.

The m core support units 20-1 to 20-m are fixed to the fixing units 41a and 41b so as to be detachable in a back-and-forth direction. The m core support units 20-1 to 20-m will be explained below by taking the core support unit 20-1 as an example.

FIGS. 11A and 11B are views showing the core support unit 20-1 in a direction indicated by arrows A1 and A2 in FIG. 10.

In the core support unit 20-1, the two toroidal Mn—Zn-based ferrite cores 22a and 22b are supported by one support plate 201. The toroidal Mn—Zn-based ferrite cores 22a and 22b are fixed to the support plate 201 by binding wires 202.

Insertion portions 203a and 203b for inserting secondary windings 24 of the transformers 1301 to 130n are formed inside the Mn—Zn-based ferrite cores 22a and 22b. An insertion portion 203c is formed between the Mn—Zn-based ferrite cores 22a and 22b.

In addition, pins 421 and 422 to be fixed to the fixing units 41a and 41b are formed on the right and left ends of the core support unit 20-1.

FIG. 11A shows a state before the core support unit 20-1 is attached to the fixing units 41a and 41b. When attaching the core support unit 20-1 to the fixing units 41a and 41b, the back surface of the support plate 201 is first inserted between the fixing units 41a and 41b, and the heads of the pins 421 and 422 come close to the holes 411 and 412. Then, when the support plate 201 is inserted deeply in the direction of an arrow B shown in FIG. 11A, the pins 421 and 422 engage with the holes 411 and 412, and the core support unit 20-1 is fixed to the fixing units 41a and 41b, as shown in FIG. 11B. The core support units 20-2 to 20-m are also fixed to the fixing units 41a and 41b in the same manner as for the core support unit 20-1.

After that, the secondary winding 24 is inserted into the insertion portions 203a and 203b while the m core support units 20-1 to 20-m are fixed to the fixing units 41a and 41b.

As described above, the second embodiment can also achieve the same effects as those of the first embodiment described previously.

In addition, in the second embodiment, the distances from the core support unit 20-6 to adjacent core support units 20-5 and 20-7 are made longer than those between other core support units, as shown in FIG. 10. Assume that in order to change the number of turns of the primary winding wound around the Mn—Zn-based ferrite core fixed to the core support unit 20-6 in this arrangement, the core support unit 20-6 is detached, and the number of turns of the primary winding is, e.g., increased. In this case, since the long distances are secured between the core support unit 20-6 and adjacent core support units as described above, it is unnecessary to change positions where other core support units are fixed to the fixing units 41a and 41b. When compared to the conventional synthesizer 130 shown in FIG. 5, therefore, an effect capable of efficiently performing works is obtained. Note that the second embodiment has been explained by taking the core support unit 20-6 as an example, but this similarly applies to other core support units.

Third Embodiment

In the third embodiment, secondary windings are connected in parallel so as to oppose primary windings 21-1 to 21-n of transformers 1301 to 130n.

FIG. 12 is a plan view showing the third embodiment of the synthesizer 130. The same reference numerals as in FIG. 3 denote the same parts in FIG. 12, and a detailed explanation thereof will be omitted.

FIG. 12 shows a state in which m core support units 20-1 to 20-m for supporting two toroidal Mn—Zn-based ferrite cores 22a and 22b around which the primary windings 21-1 to 21-n of the transformers 1301 to 130n are wound are fixed to upper and lower fixing units 23a and 23b.

A plurality of grooves 231 and 232 are formed in the fixing units 23a and 23b along a direction (a crosswise direction in FIG. 12) in which the m core support units 20-1 to 20-m are stacked.

The m core support units 20-1 to 20-m are fixed to the fixing units 23a and 23b so as to be detachable in a back-and-forth direction.

For example, a secondary winding 51-1 is inserted into an insertion portion 203a while the core support unit 20-1 is fixed to the fixing units 23a and 23b. One end of the secondary winding 51-1 is inserted through the insertion portion 203a of the core support unit 20-1, and grounded through an insertion portion 203c of the core support unit 20-1. Another end of the secondary winding 51-1 is connected to the filter unit 140. In addition, a secondary winding 51-2 is inserted into an insertion portion 203a while the core support unit 20-2 is fixed to the fixing units 23a and 23b. One end of the secondary winding 51-2 is inserted through the insertion portion 203a of the core support unit 20-2, grounded through an insertion portion 203c of the core support unit 20-2. Another end of the secondary winding 51-2 is connected to the filter unit 140.

Furthermore, a secondary winding 51-n is inserted into an insertion portion 203b while the core support unit 20-1 is fixed to the fixing units 23a and 23b. One end of the secondary winding 51-n is inserted through the insertion portion 203b of the core support unit 20-1, and grounded. Another end of the secondary winding 51-n is connected to the filter unit 140.

In the third embodiment, when changing the number of turns of the secondary winding 51-1 in the insertion portion 203a of the core support unit 20-1 from "1" to "2", while the core support unit 20-1 is fixed to the fixing units 23a and 23b, and one more secondary winding is inserted into the insertion portion 203a. Accordingly, nothing need be performed on other core support units for which the number of turns of the secondary winding is not to be changed.

Also, in the third embodiment, the n secondary windings 51-1 to 51-n are connected in parallel. Therefore, even when, e.g., the secondary winding 51-3 breaks, other core support units are left unaffected.

Fourth Embodiment

Figure 13:
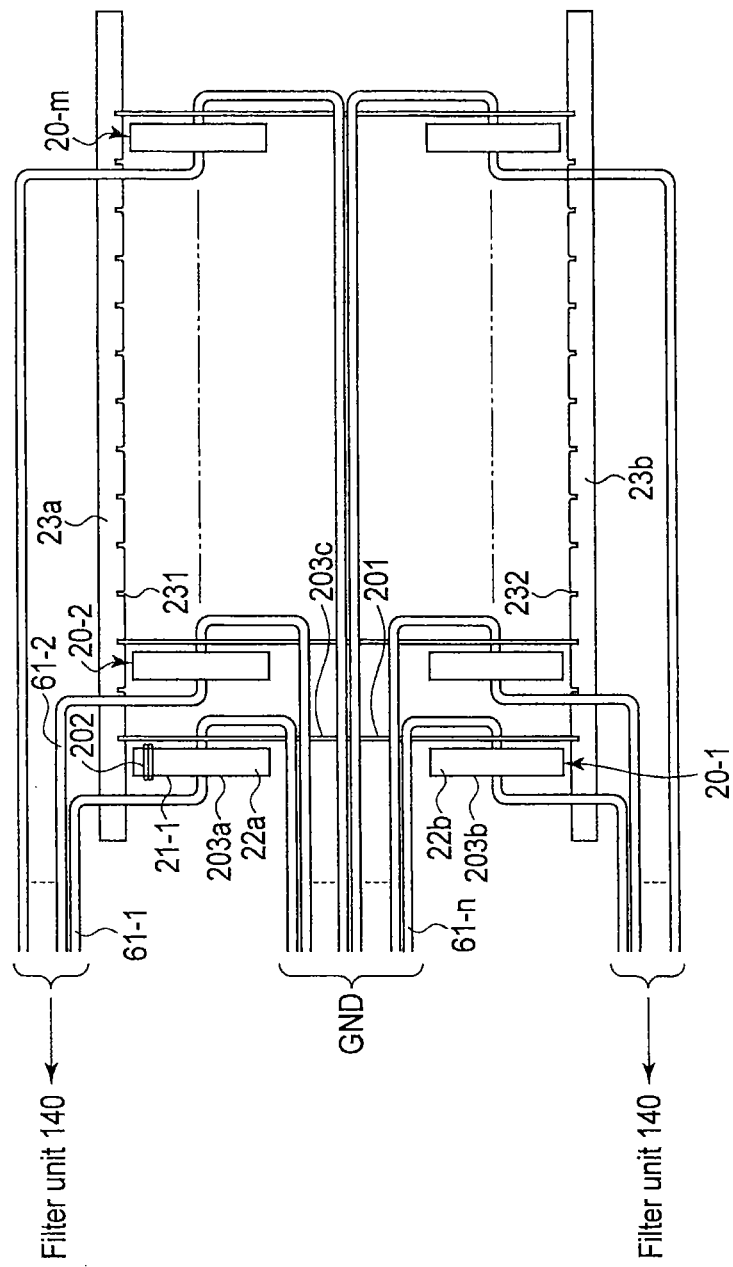
FIG. 13 is a plan view showing a synthesizer according to the fourth embodiment from the front surface.

FIG. 13 is a plan view showing the fourth embodiment of the synthesizer 130. The same reference numerals as in FIG. 12 denote the same parts in. FIG. 13, and a detailed explanation thereof will be omitted.

In the fourth embodiment, n secondary windings 61-1 to 61-n are connected in parallel so as to oppose primary windings 21-1 to 21-n of transformers 1301 to 130n. One end of some of the n secondary windings 61-1 to 61-n are inserted into Mn—Zn-based ferrite cores 22a of core support units 20-1 to 21-m, and connected to a filter unit 140. Another end of some of the n secondary windings 61-1 to 61-n are granted. One end of the rest of the n secondary windings 61-1 to 61-n are inserted into Mn—Zn-based ferrite cores 22b of the core support units 20-1 to 21-m, and connected to the filter unit 140. Another end of the rest of the n secondary windings 61-1 to 61-n are granted.

The fourth embodiment can also achieve the same effects as those of the third embodiment.

Other Embodiments

Note that an Mn—Zn-based ferrite core is assumed to be used in each of the above embodiments, but a similar synthesizer can also be formed by using an Ni—Zn-based ferrite core. It is also possible to form a similar synthesizer by using a toroidal core made of a soft magnetic material such as pure iron, an electromagnetic steel plate, an amorphous metal (Fe), or a nanomaterial.

Furthermore, in each of the above embodiments, medium-frequency broadcasting is assumed to be used, and the synthesizer synthesizes a single sine-wave signal or rectangular-wave signal, thereby generating an AM wave. However, it is also possible to generate an FM wave or OFDM wave by changing the amplitude, frequency, or phase.

In addition, each embodiment has been explained by the arrangement in which two toroidal cores are supported by the support plate 201 of the core support unit. However, the number of toroidal cores is not limited to two.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A synthesizer for a transmitter, comprising:
a transformer including a primary winding connected to a plurality of amplifiers, and a secondary winding which opposes the primary winding;
a plurality of core support units including a support plate which supports a toroidal core around which the primary winding is wound, fixing unit which fixes the toroidal core to the support plate, and an insertion portion which is formed inside or around the toroidal core and into which the secondary winding is inserted; and
a fixing member including a plurality of receiving portions to and from which the plurality of core support units are attached and detached,
wherein the plurality of receiving portions are formed along a direction in which the plurality of core support units are stacked.

2. The synthesizer according to claim 1, wherein the receiving portion includes an engaging groove to be engaged with an edge portion of the core support unit.

3. The synthesizer according to claim 1, wherein
the core support unit includes a pin to be attached to the fixing member, and
the receiving portion includes a hole to be engaged with the pin.

4. The synthesizer according to claim 1, wherein the fixing unit includes a binding wire which binds the toroidal core to the support plate, or an adhesive portion which adheres the toroidal core to the support plate.

5. The synthesizer according to claim 1, wherein a secondary winding to be inserted into an insertion portion formed inside the toroidal core is connected in parallel to a secondary winding to be inserted into an insertion portion formed inside another toroidal core.

6. A digital amplitude modulator, comprising:
a plurality of power amplifiers which are arranged in parallel and turned on or off in accordance with a voltage amplitude level of a signal to be modulated to amplify power of a predetermined signal; and
a synthesizer which syntheses outputs from the power amplifiers to generate an amplitude-modulated wave;
wherein the synthesizer comprises:
a transformer including a primary winding connected to each the power amplifiers, and a secondary winding which opposes the primary winding;
a plurality of core support units including a support plate which supports a toroidal core around which the primary winding is wound, fixing unit which fixes the toroidal core to the support plate, and an insertion portion which is formed inside or around the toroidal core and into which the secondary winding is inserted; and
a fixing member including a plurality of receiving portions to and from which the plurality of core support units are attached and detached,
wherein the plurality of receiving portions are formed along a direction in which the plurality of core support units are stacked.

7. The modulator according to claim 6, wherein the receiving portion includes an engaging groove to be engaged with an edge portion of the core support unit.

8. The modulator according to claim 6, wherein
the core support unit includes a pin to be attached to the fixing member, and
the receiving portion includes a hole to be engaged with the pin.

9. The modulator according to claim 6, wherein the fixing unit includes a binding wire which binds the toroidal core to the support plate, or an adhesive portion which adheres the toroidal core to the support plate.

10. The modulator according to claim 6, wherein a secondary winding to be inserted into an insertion portion formed inside the toroidal core is connected in parallel to a secondary winding to be inserted into an insertion portion formed inside another toroidal core.

* * * * *